(12) United States Patent
Babich et al.

(10) Patent No.: US 6,448,655 B1
(45) Date of Patent: *Sep. 10, 2002

(54) STABILIZATION OF FLUORINE-CONTAINING LOW-K DIELECTRICS IN A METAL/INSULATOR WIRING STRUCTURE BY ULTRAVIOLET IRRADIATION

(75) Inventors: Katherina Babich, Chappaqua, NY (US); Alessandro Callegari, Yorktown Heights, NY (US); Stephen Alan Cohen, Wappingers Falls, NY (US); Alfred Grill, White Plains, NY (US); Christopher Vincent Jahnes, Monsey, NY (US); Vishnubhai Vitthalbhai Patel, Yorktown Heights, NY (US); Sampath Purushothaman, Yorktown Heights, NY (US); Katherine Lynn Saenger, Ossining, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/067,439

(22) Filed: Apr. 28, 1998

(51) Int. Cl.[7] .......................... H01L 23/48; H01L 23/52; H01L 29/40
(52) U.S. Cl. .................. 257/759; 257/760; 257/767
(58) Field of Search ........................ 257/767, 760, 257/758, 751, 635, 645, 651

(56) References Cited

U.S. PATENT DOCUMENTS

| 4,210,386 | A | * | 7/1980 | Araojo et al. | 350/96.31 |
|---|---|---|---|---|---|
| 4,793,896 | A | * | 12/1988 | Douglas | 156/643 |
| 4,863,559 | A | * | 9/1989 | Douglas, II | 156/643 |
| 4,957,590 | A | * | 9/1990 | Dougals, III | 156/643 |
| 5,039,358 | A | * | 8/1991 | Brikle et al. | 148/33.3 |
| 5,082,359 | A | * | 1/1992 | Kirkpatrick | 359/642 |
| 5,204,416 | A | * | 4/1993 | Mercer et al. | 525/390 |
| 5,470,661 | A |   | 11/1995 | Bailey et al. | 428/408 |
| 5,521,424 | A | * | 5/1996 | Ueno et al. | 257/632 |
| 5,559,367 | A | * | 9/1996 | Cohen et al. | 257/77 |
| 5,602,060 | A | * | 2/1997 | Kobayashi et al. | 437/238 |
| 5,674,638 | A |   | 10/1997 | Grill et al. | 428/694 TC |
| 5,753,975 | A | * | 5/1998 | Matsuno | 257/751 |
| 5,789,325 | A | * | 8/1998 | Chandra et al. | 438/781 |
| 5,830,332 | A | * | 11/1998 | Babich et al. | 204/192.15 |
| 5,866,920 | A | * | 2/1999 | Matsumoto et al. | 257/63 |
| 5,942,328 | A |   | 8/1999 | Grill et al. | 428/408 |
| 5,981,398 | A | * | 11/1999 | Tsai et al. | 438/710 |
| 6,162,743 | A | * | 12/2000 | Chu et al. | 438/781 |

OTHER PUBLICATIONS

A. Grill et al., Development and status of Diamond–like Carbon, Chapter 5, Synthetic Diamond: Emerging CVD science and Technology, editors K.E. Spear and J.P.Dismukes, John Wiley & Sons, New York 1994.

* cited by examiner

*Primary Examiner*—Olik Chaudhuri
*Assistant Examiner*—Shrinivas H. Rao
(74) *Attorney, Agent, or Firm*—Scully, Scott, Murphy & Presser; Robert M. Trepp

(57) ABSTRACT

A method for providing regions of substantially lower fluorine content in a fluorine containing dielectric is described incorporating exposing a region to ultraviolet radiation and annealing at an elevated temperature to remove partially disrupted fluorine from the region. The invention overcomes the problem of fluorine from a fluorine containing dielectric reacting with other materials while maintaining a bulk dielectric material of sufficiently high or original fluorine content to maintain an effective low dielectric constant in semiconductor chip wiring interconnect structures.

9 Claims, 9 Drawing Sheets

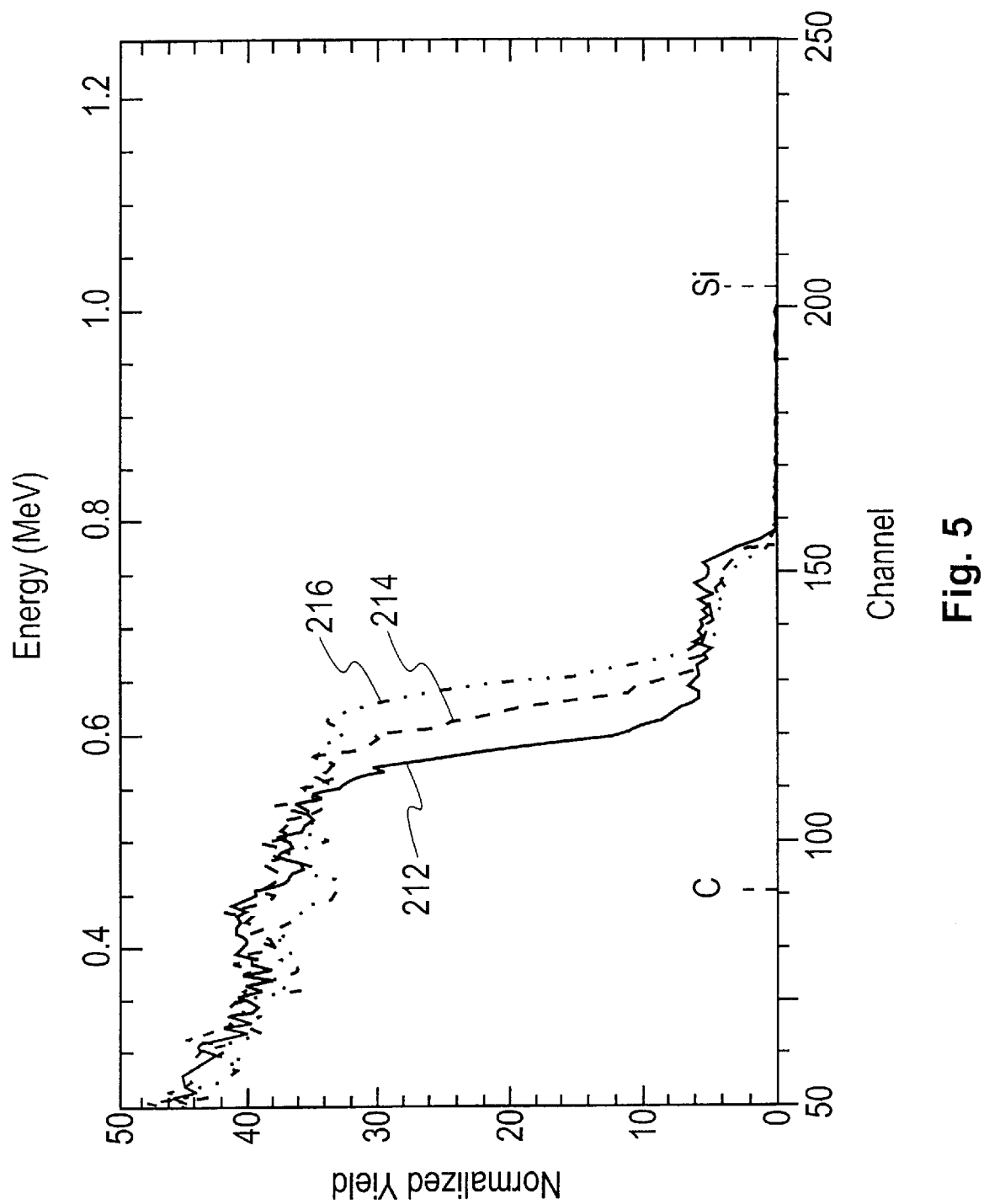

STABILIZATION OF FLUORINE-CONTAINING LOW-K DIELECTRICS IN A METAL/INSULATOR WIRING STRUCTURE BY ULTRAVIOLET IRRADIATION

FIELD OF THE INVENTION

The present invention relates to metal/insulator interconnect structures found in Very Large Scale Integrated (VLSI) and Ultra Large Scale Integrated (ULSI) devices and packaging, and more particularly to interconnect structures comprising fluorine-containing, low dielectric constant (low-k) dielectrics. Dielectric treatment methods for mitigating reliability problems associated with out-diffusion of fluorine from the low-k dielectric into other parts of such structures are taught.

BACKGROUND OF THE INVENTION

Device interconnections in Very Large Scale Integrated (VLSI) or Ultra-Large Scale Integrated (ULSI) semiconductor chips are typically effected by multilevel interconnect structures containing patterns of metal wiring layers called traces. Wiring structures within a given trace or level of wiring are separated by an intralevel dielectric, while the individual wiring levels are separated from each other by layers of an interlevel dielectric. conductive vias are formed in the interlevel dielectric to provide interlevel contacts between the wiring traces.

By means of their effects on signal propagation delays, the materials and layout of these interconnect structures can substantially impact chip speed, and thus chip performance. Signal propagation delays are due to RC time constants wherein R is the resistance of the on-chip wiring, and C is the effective capacitance between the signal lines and the surrounding conductors in the multilevel interconnection stack. RC time constants are reduced by lowering the specific resistance of the wiring material, and by using interlevel and intralevel dielectrics (ILDs) with lower dielectric constants.

The low dielectric constants of fluorine-containing dielectrics (FCD) such as fluorinated diamond-like-carbon (FDLC), fluorinated silicon oxide (FSO), and fluorinated silicate glass (FSG), make them potentially useful as ILD materials in high performance VLSI and ULSI chips where interconnect wiring capacitance must be minimized. This use for FDLC is discussed by S. A. Cohen et al. in U.S. Pat. No. 5,559,367 which issued Sep. 24, 1996 entitled "Diamond-like carbon for use in VLSI and ULSI interconnect systems."

FDLC films can be fabricated by a variety of methods including sputtering, ion beam sputtering, and dc or rf plasma assisted chemical vapor deposition with a variety of carbon-bearing source materials, as described for non-fluorinated DLC films by A. Grill and B. S. Meyerson, "Development and Status of Diamond-like Carbon," Chapter 5, in Synthetic Diamond: Emerging CVD Science and Technology, editors K. E. Spear and J. P. Dismukes, John Wiley and Sons, New York 1994, and by F. D. Bailey et al. in U.S. Pat. No. 5,470,661 which issued Nov. 28, 1995. However, fluorine-containing ILDs such as FDLC cannot be integrated into these interconnect structures without suitable capping and/or liner layers to prevent fluorine in these FCD's from reacting with other materials in the interconnect structure during required processing steps at elevated temperatures above 300 C. While ILDs with reduced fluorine contents would be expected to have smaller amounts of fluorine available to react, lower fluorine-content ILDS typically also have undesirably higher k values.

Capping materials such as the insulators silicon oxide and silicon nitride, and the conductive liner materials such as TiN have previously been described for use with fluorine-free ILDs as (i) diffusion barriers (to prevent atoms of wiring material from diffusing into the ILD, from where they may readily diffuse into active device regions), (ii) etch stop and permanent masking materials, and (iii) adhesion layers.

These prior art utilizations of capping and liner materials are illustrated in FIGS. 1, 2, 3A and 3B. FIG. 1 shows a schematic cross section view of a generic, 2-wiring-level interconnect structure 10. Interconnect structure 10 comprises substrate 20, conductive device contacts 30 in a first dielectric 40, a first and second level of conductive wiring (50, 60), and two layers of conductive vias (70, 80) embedded in layers of a second dielectric 90. Contacts to packaging dies are provided by conductive contact pads 100 in a third dielectric 110 and a capping layer or insulating environmental isolation layer 120. Interconnect structure 10 incorporates three capping materials: a conductive capping or liner material 130 lining the sidewalls and bottom surfaces of the conductive wiring and vias, an insulating capping material layer 140 overlying each wiring level over those areas not contacted by an overlying via, and an optional insulating capping layer 150 over some or all (shown) of each layer of dielectric 90. Conductive liner or capping material 130 acts to provide adhesion and prevent metal diffusion into dielectric 90; its conductivity provides electrical redundancy to conductive wiring 60, and allows it to remain in the contact regions between conductive features in different levels. Insulating capping material 140 primarily serves to prevent metal diffusion into the overlying dielectric layers, but can also prevent other potentially undesirable interactions as well as acting as an etch stop. Insulating capping material 150 is optionally left in the structure after use as an etch mask, etch stop, and/or polish stop during interconnect structure fabrication.

Interconnect structure 10 of FIG. 1 would typically be fabricated by Damascene processing in which layers of dielectric are sequentially deposited, patterned to form cavities corresponding to the pattern of conductive material desired, overfilled with the conductive material, and then planarized to remove conductive material above the dielectric. This process is repeated as necessary for each additional layer.

Interconnect structures may also be fabricated by Dual Damascene processing, in which approximately double thicknesses of second dielectric material 90 are patterned with dual relief cavities corresponding to the pattern of a wiring level and its underlying via level. FIG. 2 shows a schematic cross section view of a prior art 2-wiring-level interconnect structure 160 analogous to interconnect structure 10 in FIG. 1, except that the disposition of the capping materials 130 and 150 reflects the Dual Damascene method of processing. For example, since wiring level 60 and its underlying via level 80 are filled with conductive material in the same deposition step, there is no conductive cap material 130 between 50 and 70, a characteristic distinguishing feature of all Dual Damascene processed interconnect structures.

FIGS. 3A and 3B show two other Dual Damascene processed interconnect structures similar to interconnect structure 160 of FIG. 2, but different in the presence of insulating cap layer 170, used as an etch stop to facilitate the patterning of the dual relief cavities in the double (via plus wiring level) layers of the second dielectric material 90. In interconnect structure 180 in FIG. 3A, exposed regions of etch stop layer 170 are not removed before filling the dual relief cavities with conductive material; in interconnect structure 190 in FIG. 3B, exposed regions of etch stop layer 170 are removed before filling the dual relief cavities with conductive material.

While the interconnect structures 10, 160, 180 and 190 show two wiring levels, the number of wiring levels may be as few as one or as many as ten or more. In FIGS. 2, 3A and 3B like references are used for functions corresponding to the apparatus of an earlier Figure.

In interconnect structures wherein FCD's are introduced in place of the dielectric layers such as 90 and 110 in FIGS. 1 to 3B, delamination is encountered during the deposition of cap layers such as cap material 120 and 140 and liners such as 130 if elevated temperatures are required during their deposition. Even if the structure survives the deposition step, delamination can also occur during subsequent processing steps that require temperature excursions in excess of 300° C. For example, capping material delamination and cracking was observed in cap/FDLC (1000 nm)/Si samples after a 350° C./4 hr anneal in He. Delamination and cracking were present even in samples in which the FDLC forming the third dielectric layer 110 had been given a "stabilization" anneal (400° C. in He for 4 hours) prior to capping.

It should be noted that the need for permanent capping and liner materials in interconnect wiring structures would be substantially lessened with the use of ILD's formulated to additionally function as diffusion barriers. However, the delamination problems described above would still be a concern due to the use of these same capping/liner materials as temporary etch stops and/or hard mask materials.

It is thus an object of this invention to provide a high performance interconnect structure comprising one or more layers of uniquely conditioned and stabilized fluorine-containing dielectric insulation and one or more conductive wiring levels electrically connected by conductive vias, the wiring levels and vias optionally isolated from the fluorine-containing dielectric by current state-of-the-art insulating cap materials which may or may not be fluorine-resistant. It should be noted that the term "fluorine-resistant" is meant to describe materials that do not readily react with fluorine to form fluorine-containing compounds that interfere with the function or the mechanical integrity of the interconnect structure. One set of such fluorine-resistant materials is Al, Co and Cr which do not form volatile fluorides by reaction with fluorine at temperatures below 400° C.

It is yet another object of this invention to provide a high performance interconnect structure comprising one or more layers of uniquely conditioned and stabilized fluorine-containing dielectric insulation and one or more conductive wiring levels electrically connected by conductive vias, the wiring levels and vias completely isolated from the fluorine-containing dielectric by current state-of-the-art insulating cap materials which may or may not be fluorine-resistant.

It is a further object of this invention to provide a high performance interconnect structure comprising one or more layers of uniquely conditioned and stabilized fluorine-containing dielectric insulation and one or more conductive wiring levels electrically connected by conductive vias, the wiring levels and vias being isolated from the fluorine-containing dielectric on a first set of selected surfaces by a state-of-the-art electrically insulating capping material which may or may not be fluorine-resistant, and isolated from the fluorine-containing dielectric on a second set of selected surfaces by a state-of-the-art electrically conductive capping and/or liner material which may or may not be fluorine-resistant.

SUMMARY OF THE INVENTION

The present invention relates to metal/insulator interconnect structures found in Very Large Scale Integrated (VLSI) and Ultra Large Scale Integrated (ULSI) devices and packaging, and more particularly to interconnect structures comprising fluorine-containing dielectrics (FCD), such as low-k FCD's with or without state-of-the-art capping and/or liner materials selected primarily to prevent reliability problems associated with delamination of the various interfaces, and the out-diffusion of the conductor metal through the dielectric. Delamination problems between the fluorine-containing dielectric and the current state-of-the-art capping layers or liners are obviated by reducing the concentration of fluorine in the region of the fluorine-containing dielectric (FCD) near the FCD-capping/liner layer interface. This reduction is achieved through a combination of ultraviolet irradiation and thermal annealing of the FCD to remove fluorine from the near-interface region. By virtue of this conditioning and stabilization of the FCD, the selection of the capping layers and liners are not constrained by a need to be fluorine-resistant, thus facilitating a broader choice of materials and processing options.

The invention further provides an interconnect structure comprising one or more layers of conductive wiring patterns electrically connected by conductive vias; one or more layers of fluorine-containing dielectric (FCD) between at least some of the conductive wiring patterns; the FCD modified so that at least some interfaces of the FCD with other materials in the interconnect structure are provided with a near-interface region that extends from the interface into the FCD and has a substantially lower fluorine content. The FCD may be selected from the group consisting of fluorinated diamond like carbon (FDLC); FDLC with additives selected from the group consisting of H, Si, Ge, O, and N; fluorinated silicon oxide (FSO); fluorinated silicate glass (FSG); organo-inorganic dielectrics containing fluorine; and organic dielectrics containing fluorine.

The invention further provides a method to achieve a reduced-fluorine content region in a fluorine containing dielectric layer comprising the steps of exposing the region in the FCD layer to ultraviolet radiation to at least partially disrupt at least some of the bonded fluorine in the region; and annealing the region in the FCD layer at an elevated temperature for a certain duration to liberate at least some of the at least partially disrupted fluorine from the region thereby making the region substantially lower in fluorine concentration. At least some of the step of annealing may occur concurrently with the step of exposing the region in the FCD layer to ultraviolet radiation.

BRIEF DESCRIPTION OF THE DRAWINGS

These and other features, objects, and advantages of the present invention will become apparent upon a consideration of the following detailed description of the invention when read in conjunction with the drawings, in which:

FIG. 5 shows Rutherford Backscattering Spectroscopy (RBS) results for a fluorinated diamond-like carbon film as-deposited (A), after UV irradiation in ambient air (B), and after UV irradiation followed by a subsequent anneal at 400° C. in helium (C).

DESCRIPTION OF THE PREFERRED EMBODIMENTS

Figure 1:
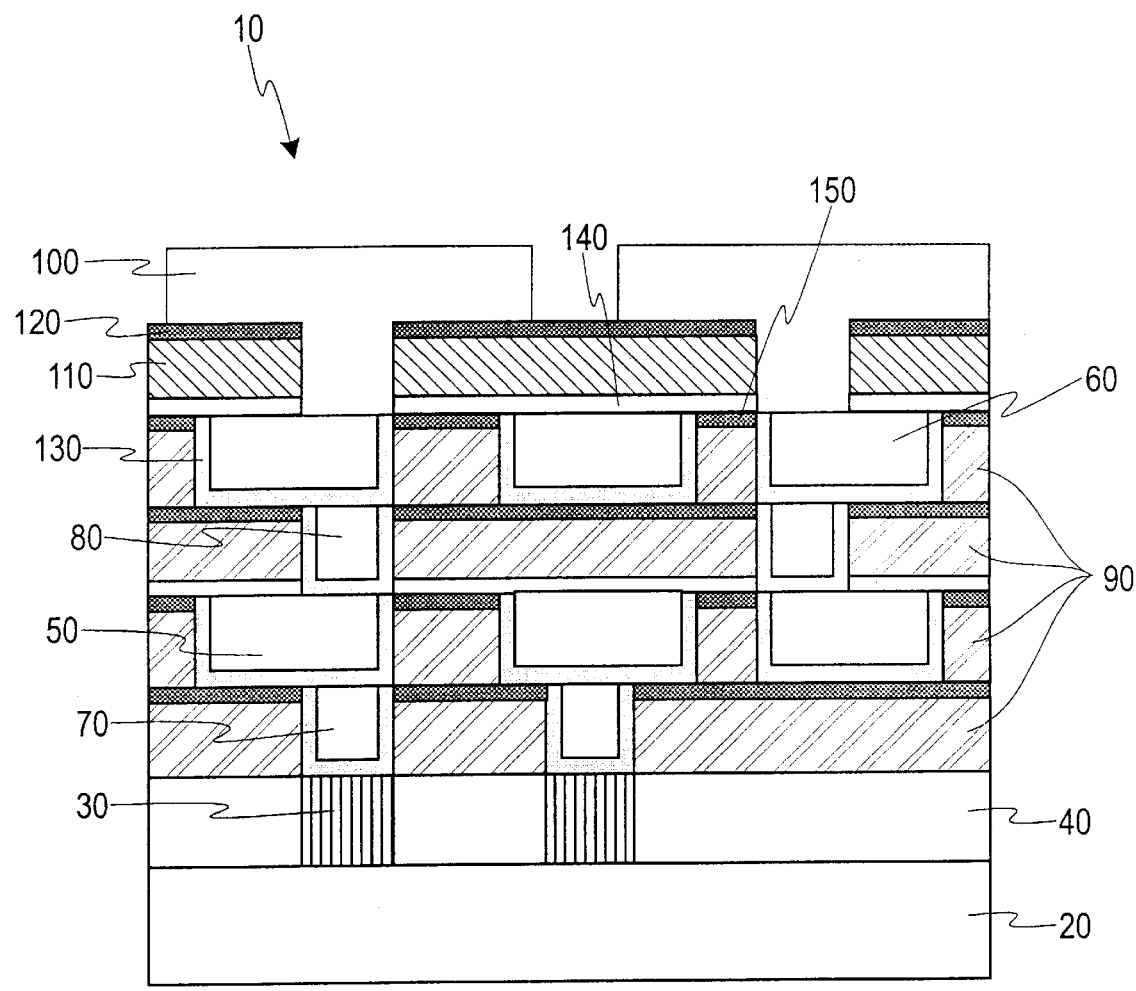
FIG. 1 shows a schematic cross section view of a generic prior art interconnect structure comprising two wiring levels.
Figure 2:
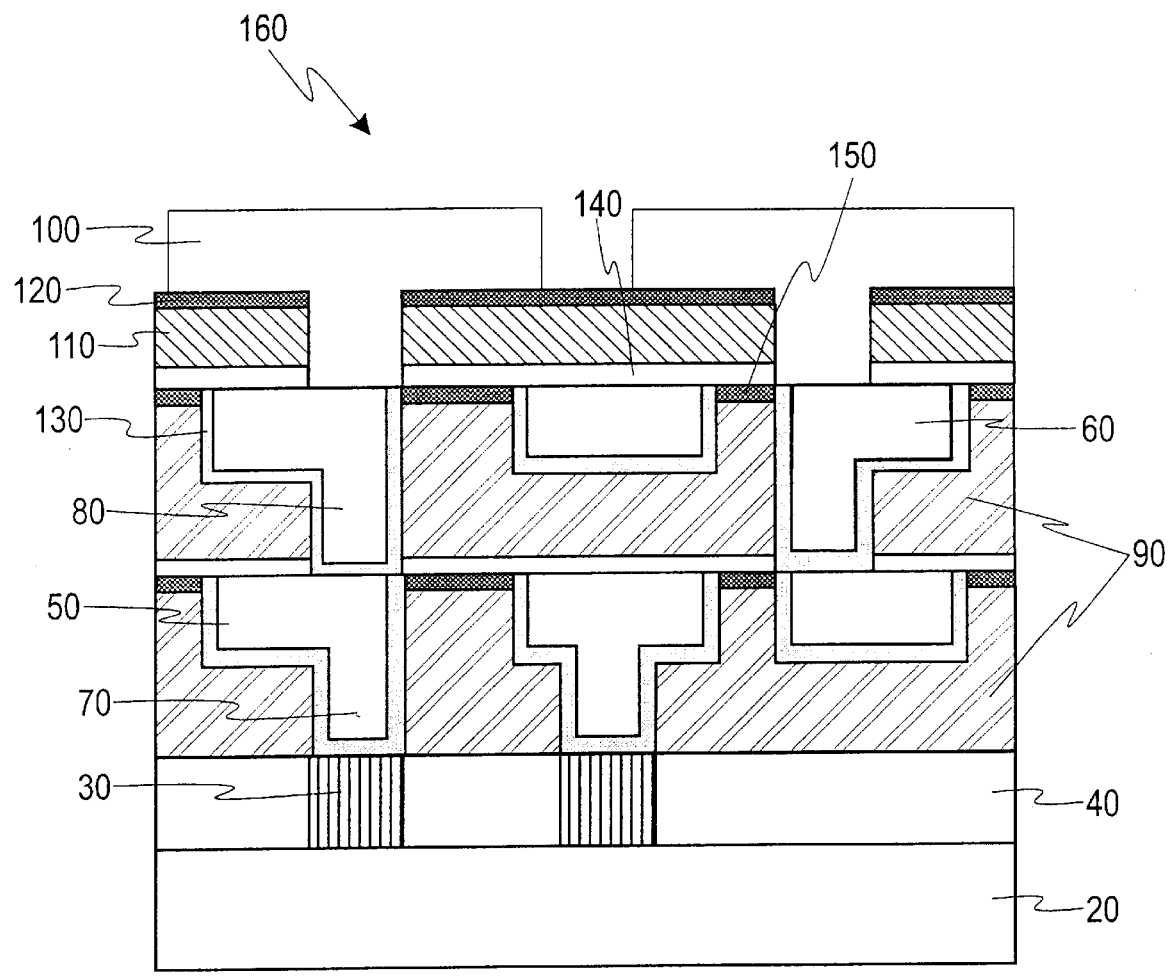
FIG. 2 shows a schematic cross section view of a variation of the generic prior art interconnect structure of FIG. 1.
Figure 3A:
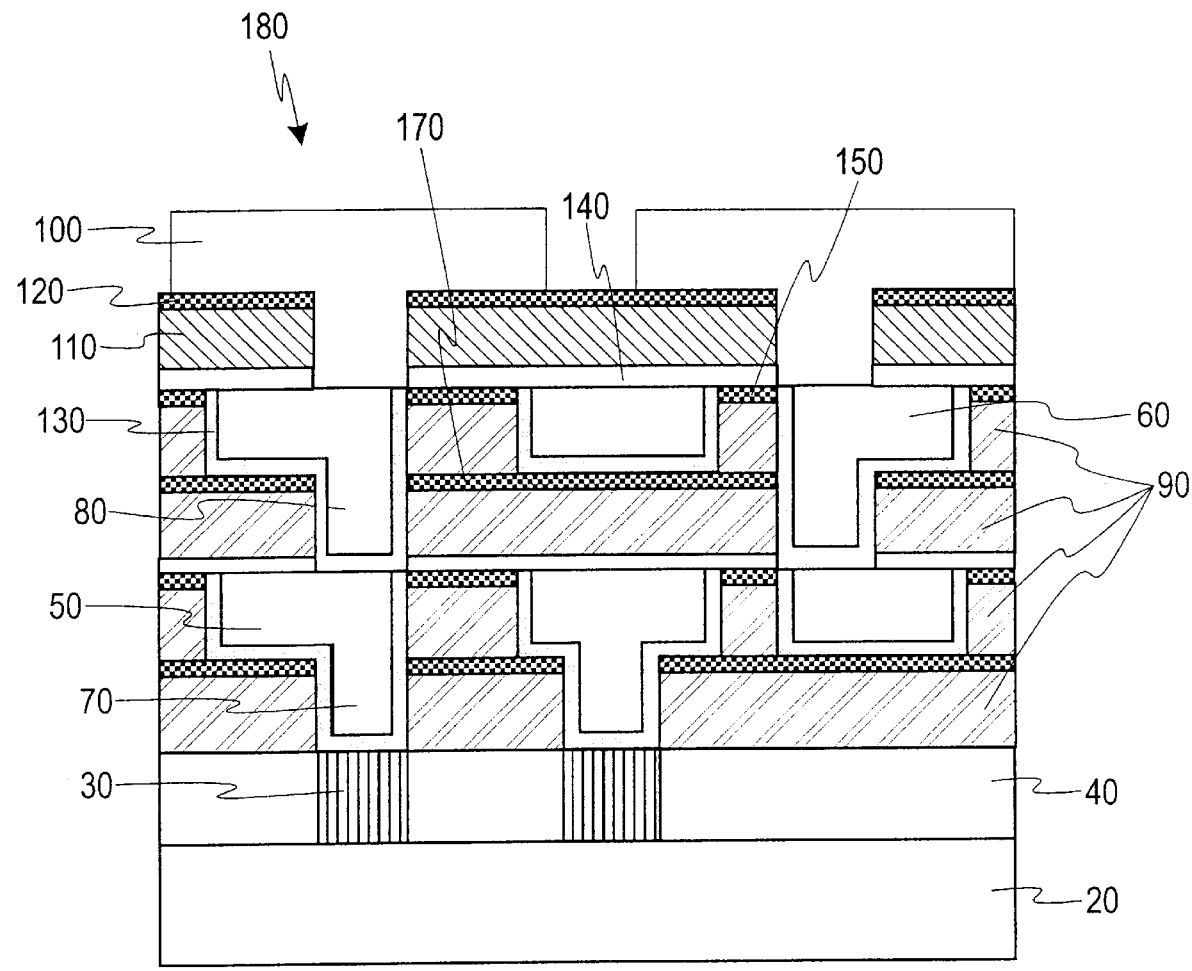
FIGS. 3A and 3B show a schematic cross section view of two more variations of the generic prior art interconnect structure of FIG. 1.
Figure 3B:
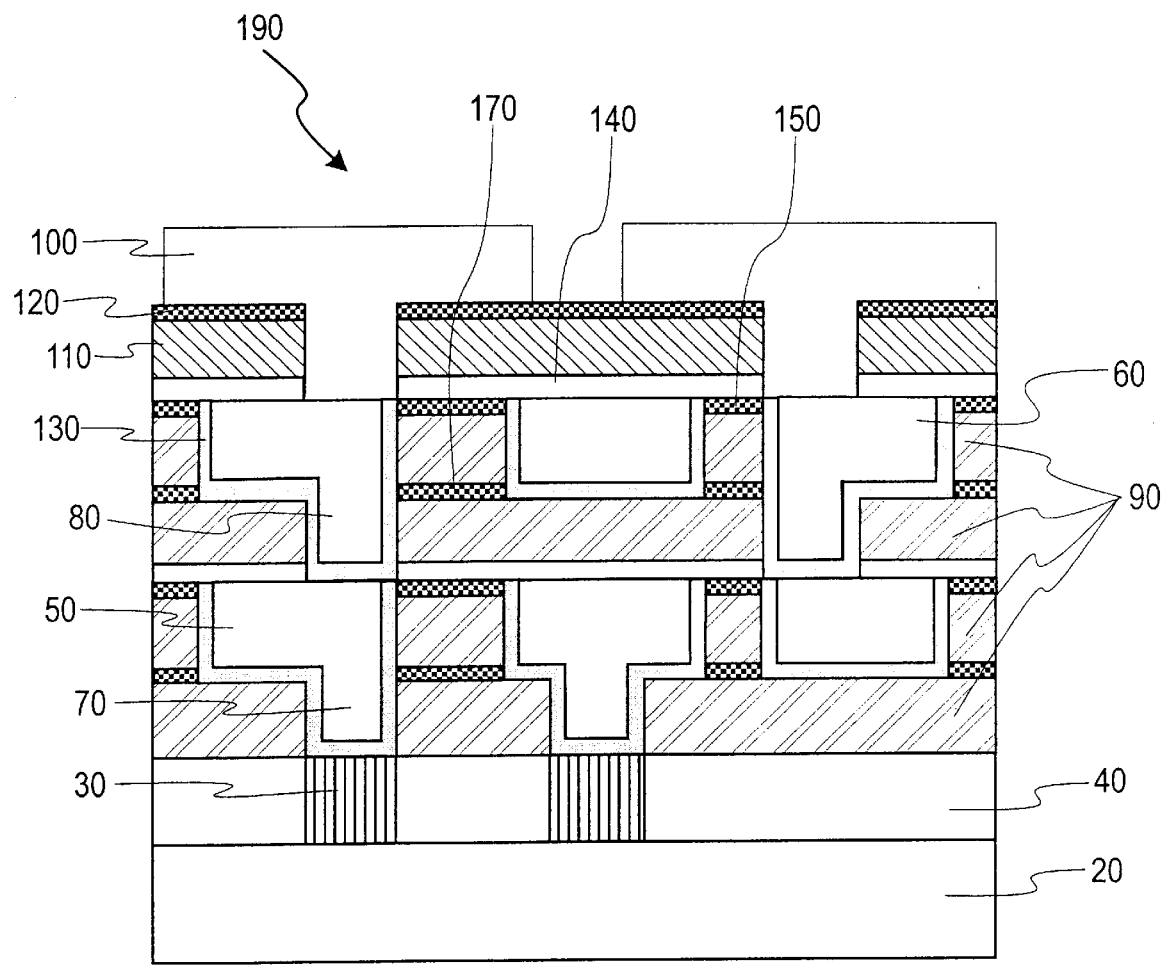

The interconnect structures of the present invention comprise layers of fluorine-containing dielectric (FCD) which are selected for low dielectric constant and processability and integrated with wiring conductor materials and optional capping/liner materials selected from materials known and used in the current state-of-the-art in microelectronic interconnection technology. For example, the electrically conductive materials used for the wiring patterns and the vias can be selected from the set comprising copper and its alloys, aluminum and its alloys, and tungsten. The insulating cap layer applied over the fluorine-containing low-k dielectric can be selected from the group comprising but not limited to inorganic materials such as silicon oxide, silicon nitride and silicon oxynitride; silicon carbo-oxide and their hydrogen containing compounds, organic materials such as polyimides, diamond-like carbon with or "PARALYENE"; organo-inorganic materials such as spin on glasses. The capping materials selected need not be fluorine-resistant and can instead be chosen from a larger set of materials silicon carbide, silicon carbo-oxide and their hydrogen containing compounds, based on their high electrical resistance, adhesion, low dielectric constant, high hardness and chemical mechanical polishing resistance, resistance to reactive ion etching plasmas, ability to protect the wiring conductor material from thermal and process chemical exposures associated with multilevel interconnect fabrication, and ability to prevent diffusion of the wiring conductor material into the fluorine-containing dielectric.

The liner material, again, need not be specially selected to be fluorine-resistant but can instead be chosen for good adhesion to the dielectric, high conductivity, efficacy as a diffusion barrier to the wiring/via materials and low ohmic contact resistance to wiring/via materials. As a result, the capping and liner materials can be chosen from a wide variety of materials available in the state-of-the-art without limiting the choices to fluorine-resistant materials such as Al, Co and Cr.

It is difficult to integrate fluorine-containing dielectrics in the prior art multilevel build process schemes because of the reactivity of the fluorine present in these FCD materials in their as-deposited state. When the next overlayer is deposited or processed at elevated temperatures (300 C. and above), this fluorine appears to react with the overlayer at its interface with the fluorine-containing dielectric. This reaction often results in a catastrophic loss of adhesion and delamination of the overlayer, thus frustrating the multilevel interconnect build process. Such a problem has been encountered while depositing capping layers like silicon oxide, silicon nitride, silicon oxynitride, and liner layers such as Ti, Ta and their nitrides, on fluorine-containing dielectrics such as fluorinated silica, fluorinated polyimides and fluorinated diamond-like carbon (FDLC). Even if the deposition is performed at ambient temperatures, the same problem occurs when the composite structure is heated to elevated temperatures in a subsequent process step.

Since the reaction and delamination appear to be phenomena localized in the region immediately adjacent to the interface between the FCD and the overlayer material with which it is in intimate contact, it is important to minimize the amount of fluorine in this region. Moreover, since fluorine is required in the bulk of the fluorine-containing dielectric to facilitate the desirably low dielectric constant, it is imperative that the defluorination does not extend throughout the bulk of the dielectric layer.

We have demonstrated a method to minimize the amount of fluorine in selected regions in fluorinated diamond-like carbon (FDLC) by means of a controlled dose exposure of the film to broad band ultraviolet radiation followed by a thermal annealing process. In a previous study, the effects of ultraviolet irradiation in non-fluorinated diamond-like carbon (DLC) films were examined as described in patent application Ser. No. 08/664,729 filed Jun. 17, 1996 by K. Babich et al., Ser. No. 08/664,729 filed Jun. 17, 1996 (Docket Y0996-083) entitled "Chemically and optically stable carbon films" and assigned to the assignee herein and found that UV irradiation of DLC in air produces an oxygen-rich surface layer at moderate UV exposure. DLC etching occurs at higher UV exposures, a fact attributed to the diffusion of surface oxygen etchant species into the bulk of the film.

In the present invention, the interaction of the UV radiation with FCD's is harnessed, in combination with a post-irradiation thermal annealing to achieve a desirable defluorination of the near-surface region of the FCD's.

Figure 4:
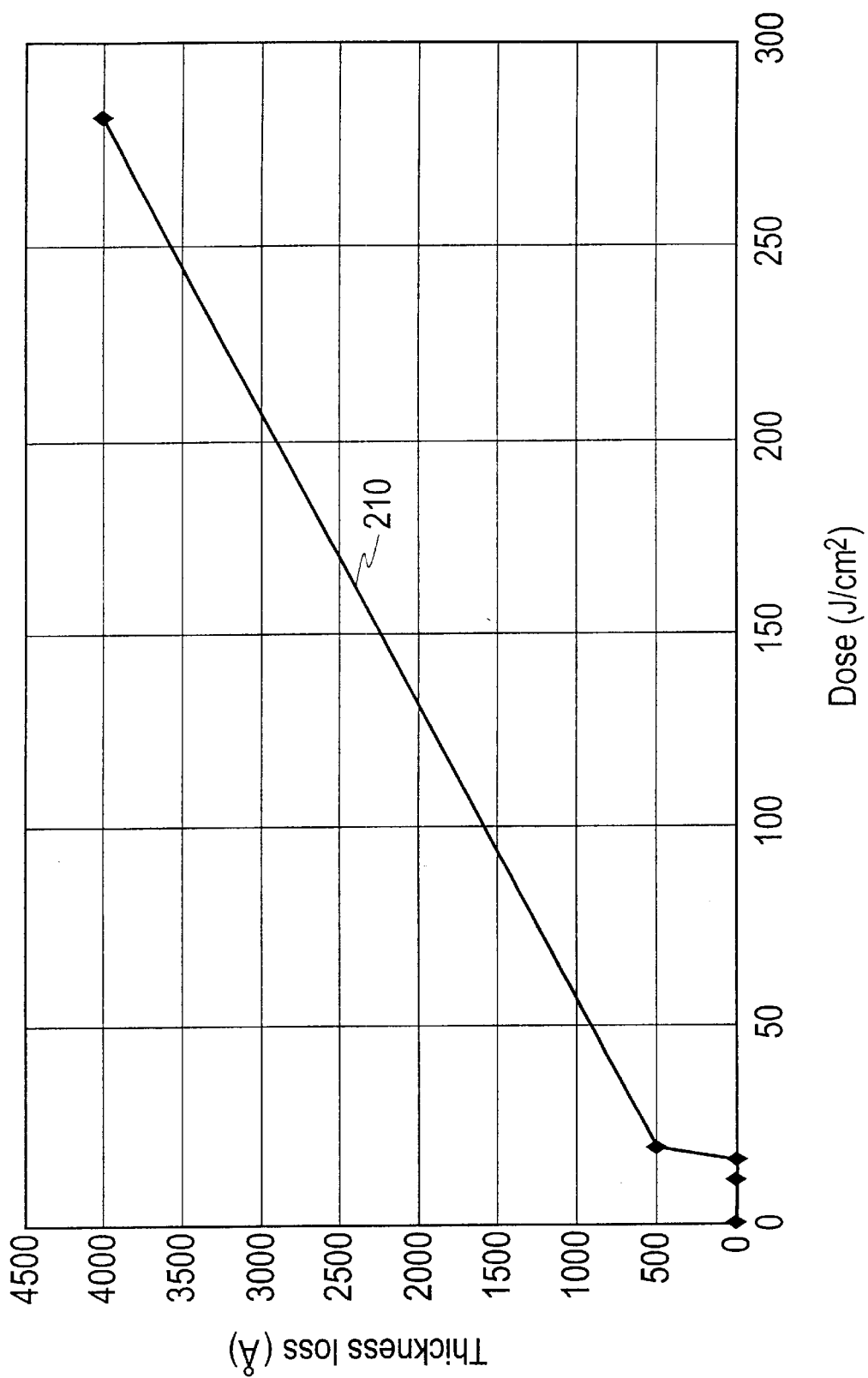
FIG. 4 shows the change or loss in FDLC film thickness with increasing amounts of UV radiation exposure.

Example 1 describes the effect of UV exposure on films of FDLC exposed to various doses of UV radiation in ambient air. The results show that significant loss of film thickness can occur in the FDLC at high UV exposure doses, but that little or no thickness loss occurs at lower doses. This result is shown by curve 210 in FIG. 4. In FIG. 4 the ordinate represents thickness loss in angstroms and the abscissa represents UV dose in Joules per square centimeter. Curve 210 shows that thickness loss is proportional to the UV dose above 20 J/cm$^2$. Based on this result for FDLC, we explored the possibility of using controlled dose UV exposure as a means to reduce near-surface fluorine content and provide enhanced overlayer adhesion.

The ultraviolet radiation incident in FDLC films is strongly absorbed in a top surface layer. Typical 1/e absorption depths are in the range from 750 Å to 2000 Å in the wavelengths ranging from 193 nm to 248 nm. For a film with a 1/e absorption depth of 1000 Å, 95% of the incident light would be absorbed in the top 3000 Å of the film.

The attenuation of the UV light resulting from this strong surface absorption would be thus expected to confine the disruption of fluorine to the near surface region and reduce the UV dose to the remainder of the FDLC film to negligible levels.

The effect of the FDLC UV treatment on the adhesion of subsequently deposited overlayers was tested by depositing a bilayer overcoat on treated FDLC. The bilayer overcoat comprised a thin bottom layer of amorphous silicon layer grown by plasma enhanced chemical vapor deposition (PECVD) at 180° C., and a top layer of silicon nitride, deposited by PECVD at 380° C. This particular structure was selected as the overlayer because its adhesion to the FDLC is very sensitive to the presence of the fluorine. We found that although in the as-deposited condition the overcoat was adherent to the untreated FDLC, adhesion loss occurred during a subsequent exposure to 400° C. annealing. Thermal annealing of the untreated FDLC at 400° C. for four hours in a helium gas ambient prior to the bilayer overcoat deposition did not produce good adhesion either. In the next experiment, the FDLC layer was first annealed at 400° C. in He for 4 hours and then subjected to UV radiation as in Example 1. This treatment also resulted in a significant delamination of the overcoat during the PECVD silicon nitride deposition.

The only combination of UV exposure and heat treatment that produced a well adhering overcoat was a controlled dose UV exposure followed by a thermal treatment, in this case an anneal at 400° C. for four hours. These results are described in Example 2. We have also demonstrated that this combination of irradiation followed by thermal annealing leads to defluorination near the surface, as shown by Rutherford Backscattering Spectroscopy (RBS). The results from this measurement, shown in FIG. 5, clearly demonstrate that fluorine is depleted from a shallow region of the FDLC near its top surface. In FIG. 5, the ordinate represents normalized yield of backscattered helium ions and the abscissa represents RBS channel number or ion energy in MeV. The depth of the defluorinated region can be changed by adjusting the total UV dose to which the FDLC films are subjected by either changing the UV radiation flux, the UV exposure time or both. It is important to control the depth of the said shallow defluorinated region because the loss of fluorine from the bulk of the fluorine-containing dielectric would result in an undesirable increase in its dielectric constant. As seen from the Examples that follow, a defluorinated depth of about 50% or less of the total FCD thickness is optimal. In Example 2, it is demonstrated that good adhesion results, as well as the preservation of the low dielectric constant, are achieved only with the unique combination of controlled dose UV irradiation followed by a thermal annealing. It is also important to note that this combination of treatments also produces a minimal change in the FDLC film thickness, typically less than 50 nm.

Although these results were demonstrated for FDLC films, with one type of thermal treatment, other thermal treatments in a broad range of temperatures (for example, 200° C. to 600° C.) and duration times (for example, is to 12 hr) might be expected to have a similar effect. In addition, we believe that this process can be extended to other organic, inorganic or organo-inorganic fluorine-containing dielectrics such as fluorosilicate glasses, fluorinated silicon oxide, fluorinated polyimides, fluorinated poly-para-xylylene such as the one sold under the trademark "PARALYENE-AF" material manufactured by Novellus Systems, Inc. and others, by adjusting the UV radiation wavelength, UV dose, and the post irradiation annealing temperature and time as required. Judicious combinations of UV irradiation and substrate heating, during as well as before and after UV exposure, could also be used to further optimize the stabilization process.

The above described invention, comprising stabilization of fluorine-containing dielectrics by a combined UV exposure and a thermal treatment can be readily used in conjunction with state-of-the-art interconnect fabrication unit processes described earlier to obtain acceptably adherent interconnect structures that integrate capping layer and liner materials known in the current art with fluorine-containing low-k dielectrics.

Examples of capping materials include silicon, silicon nitride, silicon oxide, silicon oxynitride, silicon carbide, silicon carbo-oxide and their hydrogen containing compounds, electrically insulating silicon-metal nitride, polyimide, diamond-like carbon, diamond-like carbon with additives selected from the group consisting of H, Si, Ge, O, and N, and combinations thereof.

Examples of liner materials include Cr, Ti, Ta, Nb, Zr, Mo, W, Al and electrically conductive oxides, oxynitrides, silicides, nitrides, metal silicon nitrides and combinations thereof.

Figure 6A:
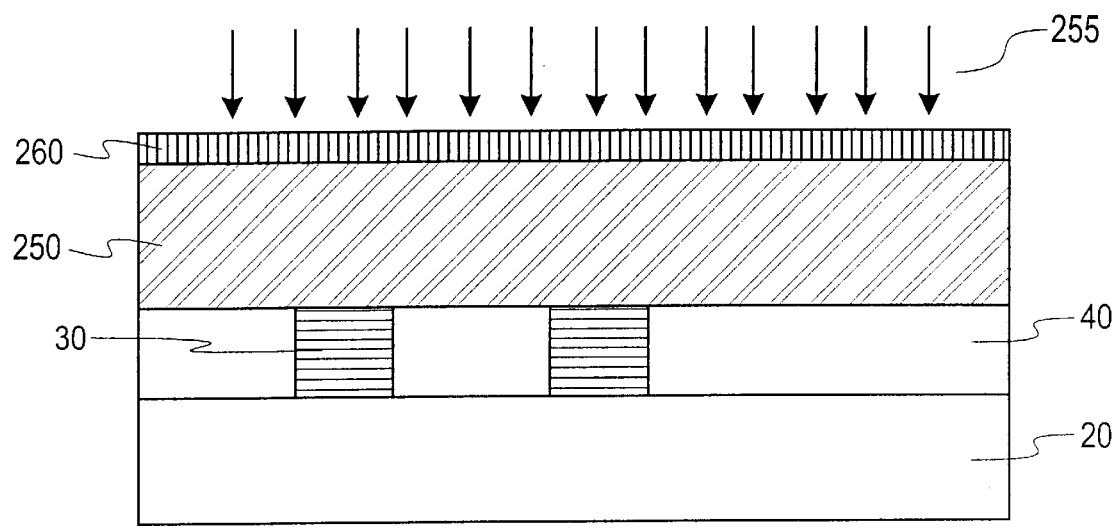
FIGS. 6A to 6D illustrate one method of incorporating the UV stabilization method of the present invention into a dual damascene process leading to a two level wiring structure.
Figure 6B:
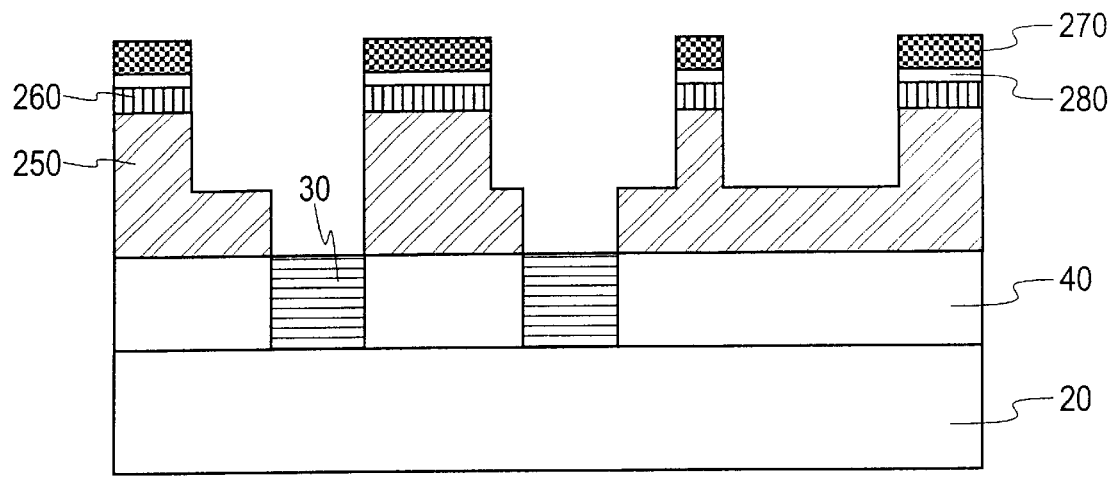
Figure 6C:
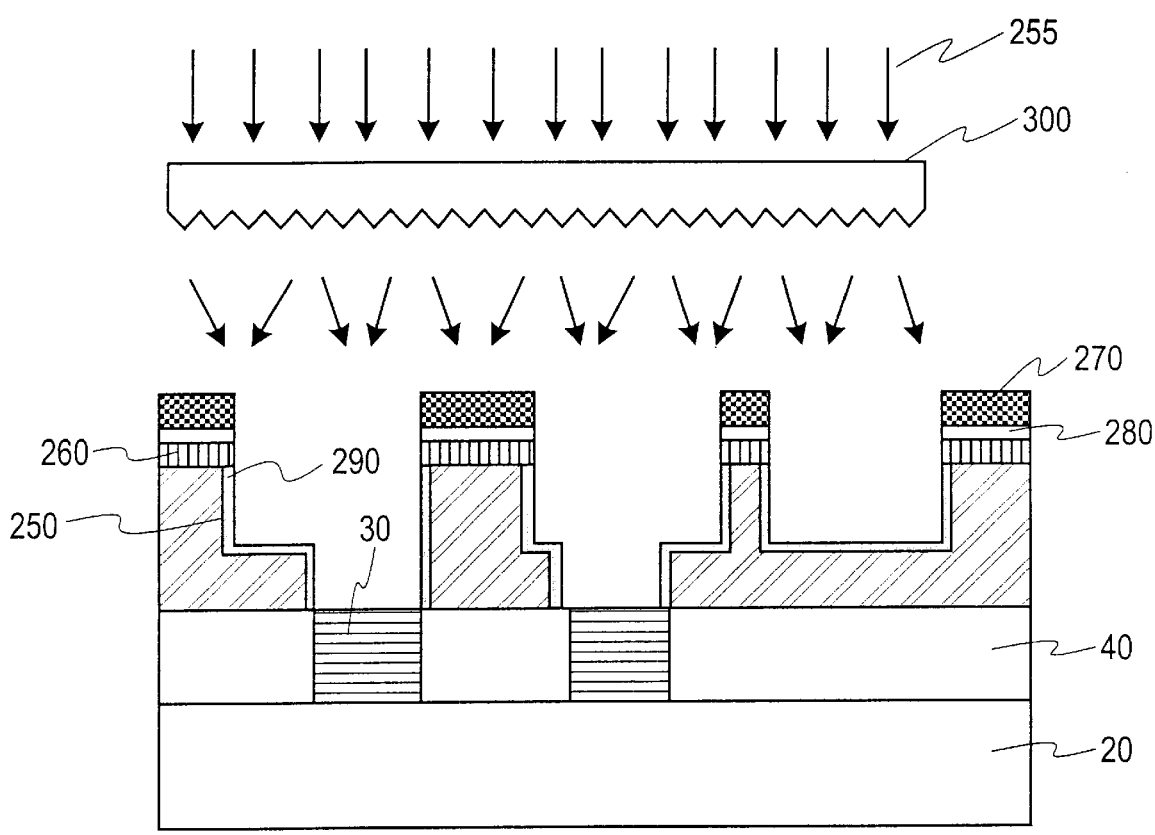
Figure 6D:
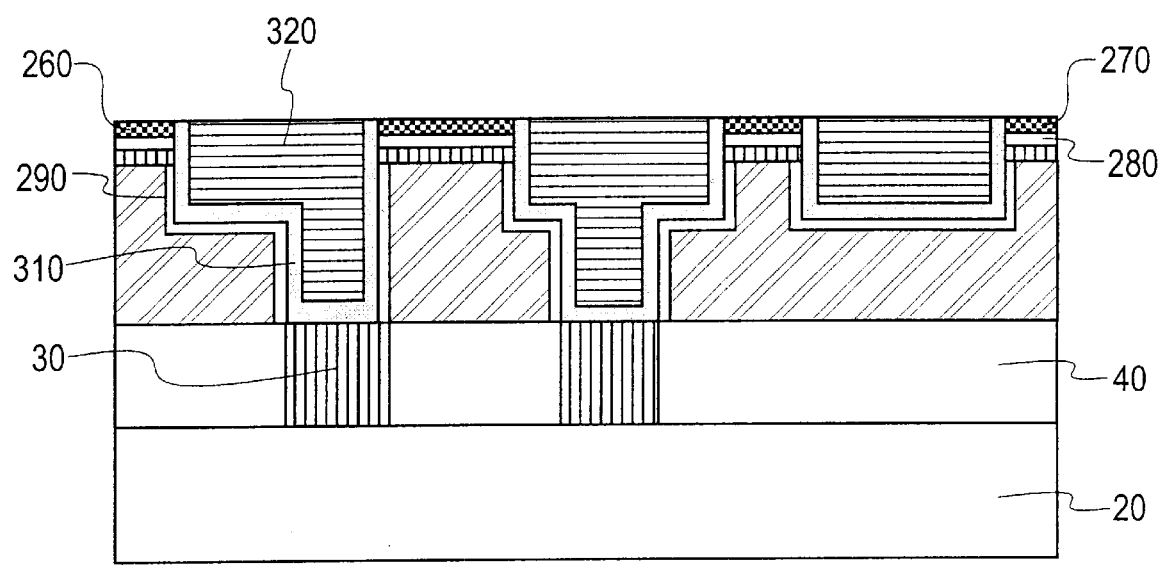

FIGS. 6A to 6D show how the UV stabilization method may be incorporated into a dual damascene process flow to construct a reliable multilevel interconnect structure comprising FCD's. On an electronic device substrate 20 provided with via terminations 30 embedded in a device passivation dielectric 40, a layer of FCD 250 is applied by a suitable coating process which may be for example CVD, PACVD or spin coating and curing. The thickness of this FCD layer 250 is chosen so that its post-stabilization thickness will be equal to the total thickness required for a via level and a wiring level dielectric combined. The wafer surface is then subjected to a controlled dose UV exposure 255, which is tailored for the specific FCD material, such as several tens of Joules/cm$^2$ in air ambient for FDLC, for example. The FCD layer is subsequently subjected to an elevated temperature annealing process, for example at 400° C. for 4 hours in an inert gas ambient such as helium. This results in a near-surface region 260 in the FCD layer 250 that is substantially free of reactive fluorine, as shown in FIG. 6A. By substantially free of fluorine, we mean that the chemical activity of fluorine in the said region is insufficient to cause the formation of fluorine-containing compounds that interfere with the function of the interconnect structure. In the next step, a single or multilayer hard mask material 270, such as silicon oxide, silicon nitride or a layered combination of such, is deposited on top of the stabilized FCD layer 250. An optional adhesion promoter layer 280 such as, for example, amorphous hydrogenated silicon (a-Si:H) can be used to enhance adhesion levels. No delamination problems are encountered since the interface region 260 in the FCD layer 250 is substantially free of reactive fluorine. Next, via and wiring level patterns are lithographically defined in hard mask layer 270, they are transferred to the appropriate portions of optional adhesion promoter layer 280, treated FCD surface layer 260 and bulk FCD layer 250 to produce the structure of FIG. 6B. The structure of FIG. 6B is then subjected to a second stabilization with UV exposure and annealing to ensure that the exposed sidewall regions of the trenches in the patterned FCD are also substantially free of reactive fluorine. It should be noted that the patterned hard mask layer 270 and optional adhesion promoter layer 280 of FIG. 6B may be selected to be strongly UV absorbing or UV reflecting to minimize further UV exposure to treated FCD surface layer 260 during the sidewall UV exposure step. A diffuser 300 (see FIG. 6C) or substrate rotation during irradiation may optionally be used to direct the UV flux to the FCD sidewalls. This UV exposure results in a region 290 along the side walls and exposed horizontal portions of the trenches and vias in the FCD layer 250 that is substantially free of reactive fluorine, as shown in FIG. 6C. At this juncture, the trenches and vias in FCD layer 250 are optionally lined with a thin conducting liner material 310 and filled with a thick higher conductivity material 320 and optionally planarized by a chemical mechanical polishing process (CMP). The resulting structure is shown in FIG. 6D. It should be noted that cap or hard mask layer 270 and liner 310 are materials known in the art and are not required to be fluorine-resistant because they are in contact with regions 260 or 290 which have been rendered substantially free of reactive fluorine so as to obviate this requirement. Multilevel structures can be fabricated by repeating this process sequence for each of the dual damascene levels needed to obtain the desired number of wiring and via levels.

Although the example above describes one particular process flow and one particular embodiment of the present invention, other process flows can also be modified in a similar fashion to integrate the FCD's without deviating from the spirit of the present invention. For example, some or all of the step of heating may be applied concurrently with the step of UV exposure, and UV irradiation may be supplied by excimer or other lasers instead of broad band lamps.

Following are detailed examples of the process steps for the UV and thermal stabilization of FDLC.

EXAMPLE 1
Effect of UV Radiation on FDLC

FDLC films were deposited on polished silicon wafers in a parallel plate reactor by PACVD using a mixture of hexafluorobenzene ($C_6F_6$), hydrogen and argon. To prevent interactions between the Si substrate and the FDLC film during deposition, a thin (40 nm) DLC layer is deposited first. The FDLC film thicknesses for UV radiation experiments were nominally 1100 nm. These wafers were cleaved into nominally identical pieces and subjected to different doses of UV radiation using a broad band mercury-xenon arc lamp source that produced UV radiation in the 200 to 400 nm wavelength range. Irradiation was performed in ambient air. Radiation flux was measured using a radiometer/band pass filter arrangement which sampled a bandwidth of 230 to 266 nm. UV dose was varied by changing the time of exposure. Samples were examined for thickness changes using step height measurements by surface profilometry, and for composition changes and mass loss by RBS analysis with 2.3 MeV $^4$He ions.

FIG. 4 shows the FDLC layer thickness loss as a function of the UV dose for a radiation flux of about 4 $mJ/cm^2$-s. It is clear that UV doses of up to 15 $J/cm^2$ do not cause any measurable thickness change. However, significant etching of the film occurs at higher doses increasing linearly with the total UV dose. For example, at 284 $J/cm^2$ dose a 52% thickness loss is observed. A subsequent anneal at 400 C. in He for four hours leads to an additional 34% loss of the already thinned film. In contrast, a thermal anneal at 400° C. for four hours (in helium or nitrogen) without any UV irradiation generally leads to a slight swelling of the film by up to 8% in thickness. However, if the FDLC film is exposed to low doses of UV and then thermally annealed to 400° C., thickness changes are minimal.

RBS analysis of the film before and after irradiation shows that there is a loss of fluorine from the near-surface region as a result of the irradiation. FIG. 5 shows RBS results for an FDLC sample as-deposited (FIG. 5 curve 212), after 18.3 $J/cm^2$ dose of UV exposure only (FIG. 5 curve 214), and after a combined treatment of 18.3 $J/cm^2$ UV exposure and a 400° C. anneal in helium for four hours (FIG. 5 curve 216). The elemental markers on the abscissa of FIG. 5 indicate the maximum ion energy (or channel number) expected for $^4$He ions backscattered from atoms of the specified element present in the sample. Analysis of curve 212 indicates that the fluorine in the as-deposited film is uniformly distributed throughout the film thickness, and has a concentration of approximately 36 at. %. The uniform distribution of fluorine can be inferred from the flatness of curve 212 between channels 125 and 155. Analysis of the film after UV irradiation alone showed the film to have a near-surface region with a fluorine concentration of 25 at. %, extending about one third of the way into the film, and a fluorine concentration of about 30 to 36 at. % in the remainder of the film. This non-uniform distribution of fluorine can be inferred from the more gentle slope of curve 214 between channels 150 and 155, which indicates that the near-surface region is depleted of F.

The RBS results for the sample subjected to UV and subsequent thermal annealing, shown as curve 216, indicate some additional fluorine loss (perhaps 20%) from the top portion of the near-surface fluorine-depleted region identified in sample B, exposed to UV only shown by curve 214. However, the thermal annealing did not appear to affect fluorine content in the subsurface region of film, which remained similar to that of sample B. As will be shown below, this fluorine depletion at the FDLC surface is correlated with an improvement in the adhesion of a subsequently deposited amorphous hydrogenated silicon/silicon nitride bilayer.

Dielectric constants of the FDLC films were also measured after the combined UV plus thermal treatment. A test structure was fabricated by depositing a 1100 nm thick FDLC film on heavily doped silicon wafers using the process described above followed by a deposition of an array of Al/Au dots on top of the FDLC film. Capacitance between the top dots and the highly conductive Si wafer substrate was measured and the dielectric constant was then calculated using the known area of the dots and the thickness of the films. The as-deposited film had a dielectric constant (k) of 2.85 while a film after UV radiation of 12 $J/cm^2$ had a k of about 3.01. Thermal anneals of the UV exposed samples for 1 or 4 hours in nitrogen at 400° C. resulted in samples with a k of 2.64. The thickness change in these samples after the combined UV exposure and thermal annealing was about 50 nm.

The experimental results detailed above demonstrate that controlled dose UV exposure in air of FDLC film combined with a post-irradiation anneal in an inert ambient can selectively reduce the fluorine content of the FDLC in the near-surface region without a significant change in film thickness or its dielectric constant.

EXAMPLE 2

Good a-Si:H/$SiN_x$ Overlayer Adhesion to FDLC with UV treatment first, followed by thermal anneal.

FDLC samples were deposited onto polished Si as in Example 1. The samples were then subjected to a UV treatment as in Example 1 followed by a 4 hour anneal at 400° C. in a pure nitrogen ambient.

The samples then received a thin (5 nm) amorphous hydrogenated silicon layer (a-Si: H) deposited at 180° C. using PECVD from 2% silane ($SiH_4$) in Ar gas mixture.

A 100 nm $SiN_x$ layer was then deposited onto the structure using a PECVD deposition process at 380° C. with a silane-ammonia-nitrogen gas mixture. In this case the films were well adherent after the deposition and could not be peeled off using a Scotch tape test. To further stress the interface the samples were then annealed again at 400° C. for 4 hours in a nitrogen ambient. The $SiN_x$ film was still well adhered to the structure even after this thermal excursion. Taken in conjunction with the RBS data described in Example 1 it can be inferred that the good adhesion is related to the controlled defluorination of the near-surface region of the FDLC prior to the overcoat deposition.

Interestingly, use of a thermal anneal at 400° C. for four hours in an inert ambient alone without any UV exposure prior to annealing did not produce adhesion between the $SiN_x$ and the FDLC good enough to survive the rigors of a post-deposition 400° C./4 hour anneal. Use of UV exposure alone without a post-irradiation anneal yielded an even more severe loss of SiN$_x$ adhesion. We therefore conclude that the unique combination of UV exposure and thermal annealing in the correct sequence, described herein, is required to achieve the desired result.

While our UV treatments were performed in air, the ambient for the UV treatment may be selected from the group containing inert gases, such as He, Ar, and N$_2$; oxygen containing gases, such as O$_2$ and N$_2$O; forming gases containing H$_2$; mixtures of the aforementioned gases, such as air; and vacuum. However, we speculate that the UV treatment may be more effective in an air or an oxygen containing ambient due to the possibility that UV radiation may produce reactive oxygen species that can attack and weaken C—F bonds in the near surface region of the film. Film annealing subsequent to UV exposure leads to the removal of the fluorine disrupted by the UV irradiation step, thus rendering the near-surface region of the FDLC film substantially free of reactive fluorine. Thermal annealing by itself without the first UV irradiation step may not be adequate to cause this bond scission. UV irradiation alone can lead to bond scission but can potentially leave the liberated fluorine in the near-surface region of the FDLC film without a post-irradiation thermal treatment to drive it off. In the case of thermal annealing alone or in the case of UV irradiation alone, the resulting surface of the FDLC layer can be reactive enough to form fluorine-containing compounds during subsequent semiconductor chip fabrication processing steps.

While there has been described and illustrated a method for providing a region of substantially lower fluorine content in a fluorine containing dielectric (FCD) layer and an interconnect structure using FCD with regions of low fluorine content, it will be apparent to those skilled in the art that modifications and variations are possible without deviating from the broad scope of the invention which shall be limited solely by the scope of the claims appended hereto.

Having thus described our invention, what we claim as new and desire to secure by Letters Patent is:

1. An interconnect structure comprising:

one or more layers of conductive wiring patterns electrically connected to each other by conductive vias;

one or more layers of fluorine-containing dielectric (FCD), each having a thickness between 100 nm and 5000 nm, selected from the group consisting of fluorinated diamond like carbon (FDLC) containing additives selected from O and N; organo-inorganic dielectrics containing fluorine; and organic polymeric dielectrics containing fluorine between at least some of said conductive wiring patterns, wherein said one or more layers of FCD have a top surface and are patterned to form vias and trenches having sidewall FCD regions that have a length which extends from said top surface to an underlying layer, said top surface and said sidewall FCD regions along said entire length contain an ultra-violet and thermal treated near-interface region having a thickness between 5 nm to 300 nm that extends from said FCD interface into said FCD which has a substantially lower fluorine content than other regions of said FCD; and an insulating cap located atop an uppermost FCD layer.

2. A structure according to claim 1 wherein said near-interface region of substantially lower fluorine content has a thickness less than ½ of the respective FCD layer thickness so as to have minimal effect on the low dielectric constant of said FCD layer.

3. The structure according to claim 1 wherein the FCD layer thickness is between 300 nm to 1200 nm.

4. The structure according to claim 1 wherein the near-interface region of substantially lower fluorine content has a thickness between 10 nm and 200 nm.

5. The structure according to claim 1 wherein the insulating cap layer includes one or more films selected from the group consisting of amorphous silicon, silicon nitride, silicon oxide, silicon oxynitride, silicon carbide, silicon-carbo-oxide and their hydrogen containing compounds, electrically insulating silicon-metal nitride, polyimide, diamond-like carbon with additives selected from the group consisting of H, Si, Ge, O and N, and combinations thereof.

6. A structure according to claim 1 wherein said conductive wiring pattern further includes a line on at least the sidewalls and bottom of respective conductors of said conductive wiring pattern, said line includes one or more films selected from the group comprising Cr, Ti, Ta, Nb, Zr, Mo, W, Al and electrically conductive oxides, oxynitrides, silicides, nitrides, metal silicon nitrides and combinations thereof.

7. A structure according to claim 1 further including a semiconductor integrated circuit substrate interconnected to said one or more layers of conductive wiring patterns.

8. A structure comprising a semiconductor packaging substrate with the interconnect structure of claim 1 disposed thereon to provide a means of interconnection and communication between microelectronic devices mounted thereon.

9. The structure according to claim 1 wherein said near-interface region is substantially free of reactive fluorine.

* * * * *